United States Statutory Invention Registration [19]

[11] Reg. Number: H434

Koszi

[43] Published: Feb. 2, 1988

[54] CONTACTS TO III-V SEMICONDUCTORS

[75] Inventor: Louis A. Koszi, Scotch Plains, N.J.

[73] Assignee: American Telephone and Telegraph Company, AT&T Bell Laboratories, Murray Hill, N.J.

[21] Appl. No.: 702,011

[22] Filed: Feb. 15, 1985

[51] Int. Cl.[4] ..... H01L 23/48

[52] U.S. Cl. ..... 357/71; 357/65; 228/1.1

[58] Field of Search ..... 357/65, 71

[56] References Cited

U.S. PATENT DOCUMENTS

| | | | |
|---|---|---|---|
| 2,973,466 | 2/1961 | Atalla et al. | 357/71 |
| 3,537,029 | 10/1970 | Kressel et al. | 357/71 |
| 3,689,332 | 9/1972 | Dietrich et al. | 357/71 |
| 4,067,039 | 1/1978 | Gaicki | 357/65 |
| 4,268,849 | 5/1981 | Gray et al. | 357/71 |
| 4,321,617 | 3/1982 | Duda et al. | 357/71 |
| 4,380,862 | 4/1983 | Nyul | 357/71 |
| 4,417,387 | 11/1983 | Heslop | 357/71 R |
| 4,510,514 | 4/1985 | Camlibel | 357/71 |

OTHER PUBLICATIONS

"Bonding Pad Induced Stresses in (Al,Ga)As Double Heterostructure Lasers," V. Swaminathan et al., *Journal of Applied Physics*, vol. 54(7), Jul. 1983, pp. 3763–3768.

"V-Grooved Substrate Buried Heterostructure InGaAsP/InP Laser," H. Ishikawa et al., *Electronics Letters*, vol. 17, No. 13, Jun. 25, 1981, pp. 465–467.

*Primary Examiner*—Stephen C. Buczinski
*Assistant Examiner*—Linda J. Wallace
*Attorney, Agent, or Firm*—Lester H. Birnbaum

[57] ABSTRACT

A contact structure and method of bonding III-V semiconductors which prevents shorting of the edges of the semiconductor chip and also allows the chip to be bonded with either major surface facing upward. Both surfaces include a gold pad surrounded by a material which is immiscible with the preform metal used to bond the chip to an outside surface. During fluxless bonding between the gold pad on one surface of the chip and the preform, the preform metal is prevented from wetting the edges of the chip. The opposite surface of the chip can be electrically contacted by wire bonding to the gold pad on that surface.

12 Claims, 4 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CONTACTS TO III-V SEMICONDUCTORS

BACKGROUND OF THE INVENTION

This invention relates to fabricating III-V semiconductor devices and, in particular, to a structure and method for bonding and electrically contacting semiconductor devices.

In the fabrication of III-V semiconductor lasers, the bonding of the device chips to suitable heat sinks or conductors and subsequent wire bonding to make electrical contact to the device are critical steps. Typically, the device is solder-bonded to an outside surface such as a heat sink or conducting pad by use of a preform comprising a metal such as In. The opposite surface of the device is then typically wire bonded to establish an ohmic contact to that surface.

In one particular example, the p-surface of an AlGaAs laser included layers of titanium and platinum over the contact to the p-type surface and a thick Au pad formed selectively over the platinum layer. This surface was bonded to a heat sink by means of an indium preform and a liquid flux including Zn and HCl. The opposite (n-type) surface included a layer of Ge-Au alloy which in some cases covered a selective area of the n-surface defined by an opening in an $SiO_2$ layer. An ohmic contact was provided to this surface by soldering a wire to the Ge-Au layer (see Swaminathan et al., "Bonding Pad Induced Stresses in (AlGa)As Double Heterostructure Lasers," *Journal of Applied Physics*, Vol. 54, p. 3763 (1983)).

While prior art bonding and electrical contact methods produced reliable devices, the procedures were time-consuming and required a high degree of operator skill. It would be more efficient, for example, to provide a wire contact to a surface by means of ultrasonic bonding techniques and, further, to provide bonding of the other surface with a fluxless preform bonding procedure, which is generally cleaner than a system using flux. Furthermore, in view of the various applications for a particular laser chip, it is desirable to provide a contact metallization which allows either major surface to be bonded to an appropriate outside surface while the opposite device surface can be chemically contacted. During the solder-bonding of either surface, it is also necessary to prevent the solder from flowing along the sides of the chip and causing short circuiting of the junction. It is therefore desirable to include in the metallization some means for stemming the flow of solder metal to the edges of the major surfaces of the chip.

It is therefore an object of the invention to provide a metallization and a bonding procedure with the above-described desirable features.

SUMMARY OF THE INVENTION

This and other objects are achieved in accordance with the invention which, in one aspect, is a semiconductor device suitable for solder-bonding to an outside surface and having one major surface comprising a p-type III-V semiconductor material and an opposite major surface comprising an n-type III-V semiconductor material. The device further comprises a metal pad consisting essentially of Au formed over a selected area of both major surfaces. The devices also includes a material surrounding the metal pad over both major surfaces, which material is immiscible with the solder so as to prevent the solder from flowing to the edges of the device during solder-bonding.

In accordance with another aspect, the invention is a method of fabricating a semiconductor device which includes one major surface comprising a p-type III-V semiconductor material and another major surface comprising an n-type III-V semiconductor material. The method comprises the step of bonding one of the major surfaces of the device to an outside surface by providing a fluxless solder preform between a metal pad over said major surface and said outside surface and heating to melt the solder while the solder is prevented from flowing to the edges of the major surface. An ohmic contact is applied to a metal pad over the other major surface by contacting a wire to the metal pad and applying sonic energy thereto.

BRIEF DESCRIPTION OF THE DRAWING

These and other features of the invention are delineated in detail in the following description. In the drawing.

It will be appreciated that for purposes of illustration, these figures are not necessarily drawn to scale.

DETAILED DESCRIPTION

Figure 1:
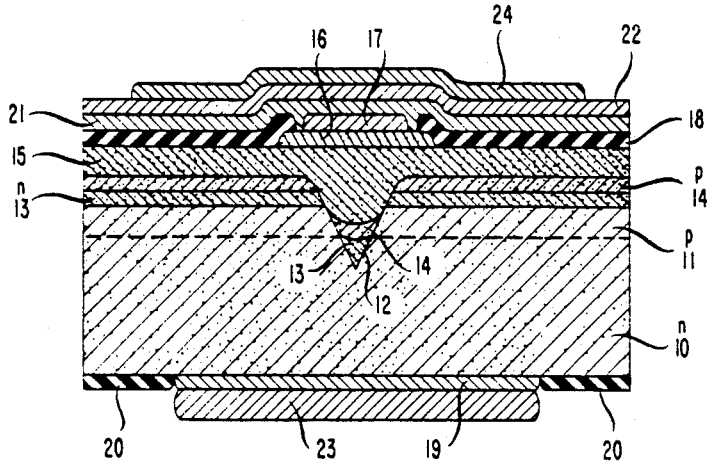
FIG. 1 is a cross-sectional view of a device in accordance with one embodiment of one aspect of the invention.

FIG. 1 illustrates in cross section one embodiment of the structural aspects of the invention. The device is a semiconductor laser comprising an n-type substrate, 10, of InP with a p-type surface region, 11, formed by diffusion of Cd into the substrate surface. A V-groove, 12, is formed in the same substrate surface. Formed over the surface, and included in the region of the V-groove, are sequential layers 13 and 14 comprising, respectively, n-type InP and p-type InGaAsP. The portion of layer 14 within the V-groove comprises the active (light-emitting) region. An epitaxial layer, 15, comprising p-type InP is formed over the layer 14. A mesa portion, 16, is formed over the V-groove area by depositing an epitaxial layer comprising InGaAs or InGaAsP and etching the unwanted area. This particular type of semiconductor laser structure is known in the art as a V-groove channeled substrate buried heterostructure and is described, for example, in Ishikawa et al, *Electronics Letters*, Vol. 17, p. 465 (1981). Of course, the invention is not limited to this particular semiconductor structure and should be applicable to all types of III-V devices requiring solder attachment to heat sinks, conductors, or other outside surfaces.

Ohmic contact to the p-surface of the device was provided by a layer, 17, in this case comprising layers of Au-Zn-Au sequentially deposited by evaporation and patterned using a photoresist lift-off in a window of an $SiO_2$ layer, 18, which was formed over the surface of the epitaxial layer 15 and over part of the mesa portion 16. Ohmic contact was generated by alloying the Zn metal to the mesa portion 16. Ohmic contact to the n-type surface was provided by a layer, 19, of an Au alloy, which in this example was Ge-Au with proportions of 12 percent by weight Ge and 88 percent by weight Au. The layer was approximately 3000 Angstroms thick and was also deposited in a window of an $SiO_2$ layer, 20, by a standard photoresist lift-off procedure. The layers, 18 and 20, were formed by plasma deposition. The Ge-Au layer, 19, was in the shape of a rectangle surrounded on four sides by the $SiO_2$ layer. The Ge-Au layer, 19, was also aligned with the contact layer, 17, by means of a standard infrared imaging photomask aligner.

Subsequent to the formation of the contact layers, 17 and 19, additional layers of metals, 21 and 22, in this case titanium and platinum, respectively, were deposited over the entire p-surface of the device. The titanium layer, 21, was approximately 1000 Angstroms thick, while the platinum layer was approximately 1500 Angstroms thick. The layers were deposited by triode-sputtering ad sintered at a temperature of 250 degrees C. for 5 minutes.

Next, a pad, 23, consisting essentially of Au, was formed over the n-surface of the device. The pad was deposited by electroplating to a thickness of 3000–5000 Angstroms so that the Au was limited to the area of the Ge-Au pad 19 previously formed on the semiconductor surface. The Au pad was, therefore, surrounded on all sides by the $SiO_2$ layer 20. The thickness of the pad is preferably in the range 3000 Angstrms-1 μm to avoid significant stress on the semiconductor which could increase the degradation rate of the device. In this example, the pad was pure Au (less than 1 part per thousand of impurity). However, pads having at least 99 percent Au may be usable in the present invention.

Another pad, 24, consisting essentially of Au, was then formed selectively over the p-surface of the device. This was accomplished with a standard photoresist (not shown) which was developed to expose the underlying platinum layer in the desired area. The Au was then deposited by electroplating to a thickness of approximately 3000–5000 Angstroms, followed by removal of the photoresist to leave the pad in the desired area. The pad, therefore, was surrounded by the layer of platinum around the edges of the device. Again, it is desirable that the thickness of the pad be in the range 3000 Angstroms-1 μm to avoid undue stress and that the pad be at least 99 percent Au.

Figure 2:
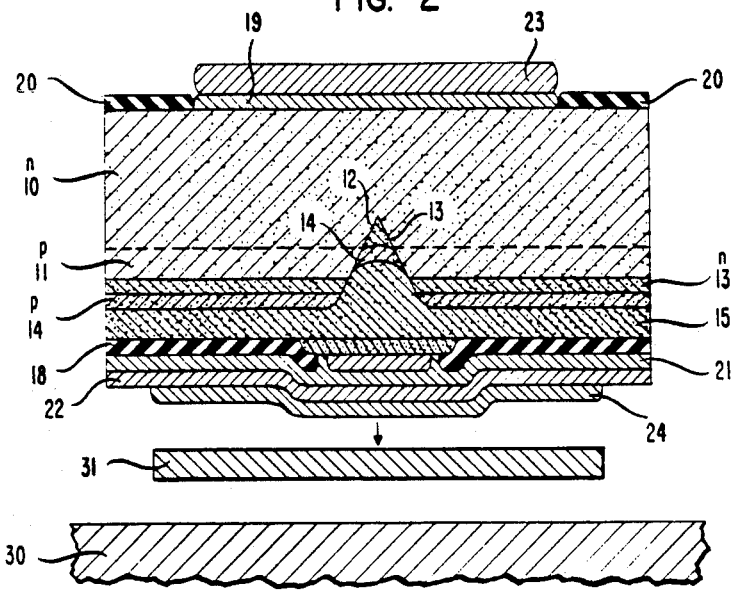
FIG. 2 is a schematic illustration of the bonding of the device of FIG. 1 in accordance with an embodiment of another aspect of the invention.
Figure 3:
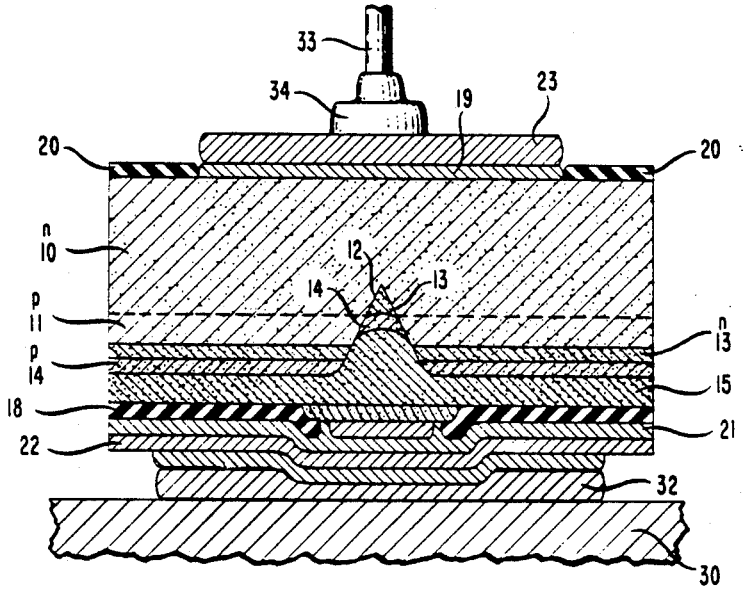
FIG. 3 is a cross-sectional view of the device of FIG. 1 at a later stage of fabrication in accordance with the same embodiment of said another aspect of the invention.

Either major surface of the completed structure can then be bonded to an outside surface. For example, FIGS. 2–3 illustrate bonding of the device in accordance with one embodiment of the method aspects of the invention. In this example, the p-surface of the device is bonded to the surface of a heat sink, a portion of which is illustrated as 30. To provide the solder bond, a fluxless preform, 31, consisting essentially of In, was provided between the Au pad, 24, on the p-surface of the device and the heat sink. The preform was approximately 6–9 82 m thick and measured approximately 250 μm×500 μm. The preform was deposited on the surface of the heat sink and the device placed directly thereon. The structure was then heated to melt the solder with no bonding weight or pressure applied to the device. In this example, the heating was at a peak temperature of approximately 245 degrees C. for approximately 20 seconds.

As illustrated in FIG. 3, the above technique results in a bonding of the p-surface to the heat sink by a mound of an alloy of In and Au, 32. An important point to note is that the alloyed solder, 32, after melting, is essentially confined to the area of the Au pad and does not flow to the edges of the device. This is because the platinum layer, 22, is immiscible with the in from the preform. Consequently, the portion of the platinum surrounding the Au pad acts as a barrier to the flow of the solder to the edges, and electrical shorting caused by such solder flow is essentially eliminated.

As also illustrated in FIG. 3, the n-surface of the device was provided with an ohmic contact to outside circuitry by means of a wire, a portion of which is shown as 33. The wire was bonded to the Au pad 23 by means of a ball bond, 34, which was formed from the wire by standard techniques. The wire was bonded to the pad by contacting the ball bond and pad while applying ultrasonic and thermal energy. In particular, the wire was attached ultrasonically at a frequency of approximately 63 KHz while maintaining the heat sink and bonded chip at a temperature of 80 degrees C. for 1 minute according to known techniques to establish the bond. The ability to thermosonically wire bond is one advantage of the Au pad 23 over the n-surface. Such a technique is much faster than the solder-bonding usually employed to contact the n-surface.

Figure 4:
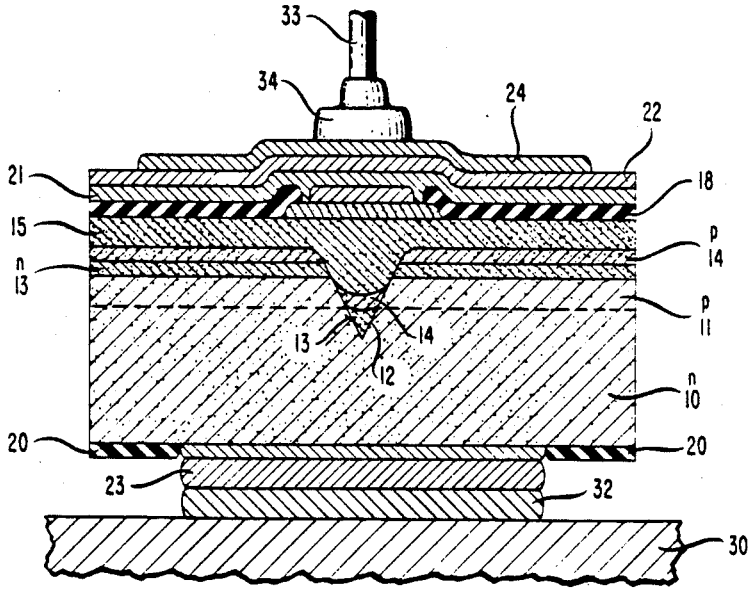
FIG. 4 is a cross-sectional view of the device of FIG. 1 at a later stage of fabrication in accordance with a further embodiment of said another aspect of the invention.

As illustrated in the embodiment of FIG. 4, the n-surface of the device can be bonded to heat sink 30 by the same or a similar solder 32 in the same manner as previously described for the p-surface. Here, the solder is essentially limited to the Au pad 23 because the $SiO_2$ layer, 20, is immiscible with the In preform. Thus, in this embodiment, the $SiO_2$ layer surrounding the pad acts as a barrier to solder flow to the edges of the device. As also shown in FIG. 4, the p-surface can be provided with an ohmic contact by thermosonically bonding a wire 33 to the Au pad 24 over said surface in the same manner as previously described for the n-surface.

It will be appreciated from the foregoing that the presence of an essentially pure Au pad surrounded by a layer of either platinum (p-surface) or $SiO_2$ (n-surface) provides unique advantages in bonding III–V devices. However, other materials can be employed for the same purposes. For example, other layers which are immiscible with In can be provided around the pads as a barrier. A silicon nitride layer may be usable in place of the $SiO_2$ layer, and other oxidizable metals which provide a good barrier, such as Mo and Cr, might be used in place of Pt. Further, other types of solder preforms, such as those containing Pb and Sn, might be employed in place of In and appropriate materials compatible therewith substituted for those previously mentioned. In addition, although the invention has been described in terms of laser devices, other III–V semiconductor devices may take advantage of the contact structure and method of bonding described herein.

It will also be appreciated that although fabrication of a single device has been shown, typically the devices are batch fabricated in a single semiconductor wafer and then separated into individual devices by scribing and cleaving. The use of the selectively formed Au pads 23 and 24 provides an additional benefit in this regard since full area contacts on the major surfaces would form a hinge during cleaving requiring time-consuming and delicate chip separation. Cleaving outside the area of the Au pads eliminates this problem.

Various additional modifications will become apparent to those skilled in the art. All such variations which basically rely on the teachings through which the invention has advanced the art are properly considered within the scope of the invention.

What is claimed is:

1. A semiconductor device suitable for bonding with solder to an outside surface ad having one major surface comprising a p-type III–V semiconductor material and an opposite major surface comprising an n-type III–V semiconductor material, said device further comprising:

a metal pad consisting essentially of gold formed over a selected area of both major surfaces; and a material surrounding said metal pad over both major surfaces, said material being immiscible with the solder so as to prevent the solder from flowing to the edges of the device during solder-bonding.

2. The device according to claim 1 wherein the p-type and n-type materials comprise a portion of a semiconductor laser.

3. The device according to claim 1 wherein the material surrounding the metal pad is selected from the group consisting of platinum and silicon dioxide.

4. The device according to claim 1 wherein the thickness of the metal pads is within the range 3000 Angstroms-1 μm.

5. The device according to claim 1 wherein the III–V semiconductor material comprises InP.

6. The device according to claim 1 further comprising a conducting surface solder-bonded to the metal pad over one major surface and an electrical wire thermosonically bonded to the metal pad over an opposite metal surface.

7. A method of fabricating a semiconductor device which includes one major surface comrising a p-type III–V semiconductor material and one major surface comprising an n-type III–V semiconductor material comprising the steps of:

solder-bonding one of the major surfaces of the device to an outside surface by providing a fluxless solder preform between a metal pad over said major surface and said outside surface and heating to melt the solder while the solder is prevented from flowing to the edges of the major surface; and applying an electrical contact to a metal pad over the other major surface by contacting a wire to the metal pad and applying sonic energy thereto.

8. The method according to claim 7 wherein the solder preform consists essentially of indium.

9. The method according to claim 7 wherein the solder is prevented from flowing to the edges by a material which is immiscible with said solder surrounding the metal pad.

10. The method according to claim 7 wherein the metal pads consist essentially of gold.

11. The method according to claim 9 wherein the surrounding material on one major surface comprises platinum and on the other major surface comprises silicon dioxide.

12. The method according to claim 7 wherein the III–V semiconductor material comprises InP.

* * * * *